United States Patent
Tsai et al.

(10) Patent No.: US 9,219,471 B2
(45) Date of Patent: Dec. 22, 2015

(54) CIRCUITRY FOR PHASE DETECTOR

(71) Applicant: Taiwan Semiconductor Manufacturing Company Limited, Hsin-Chu (TW)

(72) Inventors: Tsung-Hsien Tsai, Zhongli (TW); Chia-Chun Liao, Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 55 days.

(21) Appl. No.: 14/260,315

(22) Filed: Apr. 24, 2014

(65) Prior Publication Data

US 2015/0311889 A1 Oct. 29, 2015

(51) Int. Cl.
*H03D 13/00* (2006.01)
*H03K 5/14* (2014.01)
*H03K 3/356* (2006.01)

(52) U.S. Cl.
CPC .............. *H03K 5/14* (2013.01); *H03D 13/009* (2013.01); *H03K 3/356* (2013.01)

(58) Field of Classification Search
CPC ........................................ H03D 13/00–13/009
See application file for complete search history.

(56) References Cited

U.S. PATENT DOCUMENTS

| 6,877,123 | B2 * | 4/2005 | Johnston et al. | 714/731 |
|---|---|---|---|---|
| 7,129,757 | B2 * | 10/2006 | Geer et al. | 327/12 |
| 7,139,865 | B2 * | 11/2006 | Urard | 711/104 |
| 7,760,840 | B2 * | 7/2010 | Chang | 375/376 |
| 8,270,552 | B1 * | 9/2012 | Oner | 375/354 |
| 8,638,144 | B1 * | 1/2014 | Shyu et al. | 327/158 |
| 8,686,764 | B2 * | 4/2014 | Bulzacchelli et al. | 327/108 |
| 2004/0095170 | A1 * | 5/2004 | Sugimoto et al. | 327/141 |
| 2009/0243661 | A1 * | 10/2009 | Xue | 327/12 |
| 2011/0158031 | A1 * | 6/2011 | Ware et al. | 365/233.11 |
| 2013/0063181 | A1 * | 3/2013 | Chou et al. | 327/7 |
| 2015/0015314 | A1 * | 1/2015 | Dally | 327/160 |
| 2015/0188527 | A1 * | 7/2015 | Francom et al. | H03K 5/14 |

* cited by examiner

*Primary Examiner* — Thomas J Hiltunen
(74) *Attorney, Agent, or Firm* — Cooper Legal Group, LLC

(57) ABSTRACT

A circuit for a phase detector is provided. A first buffer of the circuit receives a data signal and generates a first modified data signal using the data signal. A notifier receives the data signal and determines whether a violation exists. A first multiplexer receives the first modified data signal and transmits a first multiplexer signal to a second multiplexer. The second multiplexer receives the first multiplexer data signal and the first modified data signal, and transmits a second multiplexer data signal to a flip-flop of the phase detector.

20 Claims, 9 Drawing Sheets

CIRCUITRY FOR PHASE DETECTOR

BACKGROUND

A phase detector comprises one or more flip-flops, such as a D flip-flop, and is a component used in phase locked loop circuitry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
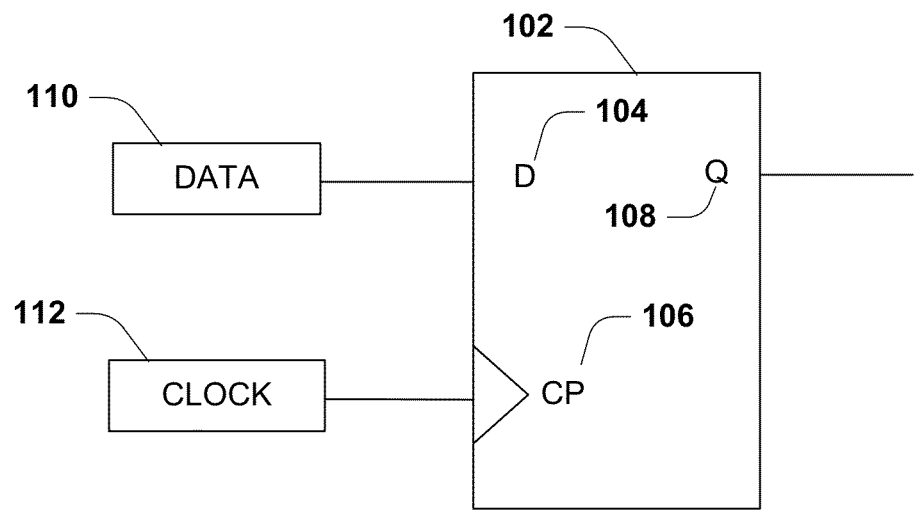
FIG. 1 is an illustration of a flip-flop, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, circuitry for a phase detector is provided. In some embodiments, output of the circuitry is applied to a flip-flop of the phase detector. In some embodiments, the output of the circuitry causes a Q-output of the flip-flop to have a random value which is more reflective of the behavior of the flip-flop. According to some embodiments, since real flip-flops are not ideal, having the value at the Q-output be random allows the behavior of the phase detector or of a phase locked loop circuit that uses the phase detector to be more accurately modeled. A model or simulation of an integrated circuit, such as including a phase locked loop, that implements the phase detector thus more accurately represents or predicts the behavior of the integrated circuit should the integrated circuit be physical constructed in the real world.

FIG. 1 illustrates a flip-flop 102, such as a D flip-flop. In some embodiments the flip-flop 102 is used in a phase detector, such as where the phase detector is used in phase locked loop circuitry. In some embodiments, the flip-flop 102 comprises a D-input 104, a CP-input 106 and a Q-output 108. In some embodiments, data is received via the D-input 104. In some embodiments, the data is received via a data source 110 connected to the D-input 104. In some embodiments, a clock 112 is connected to the CP-input 106.

Figure 2:
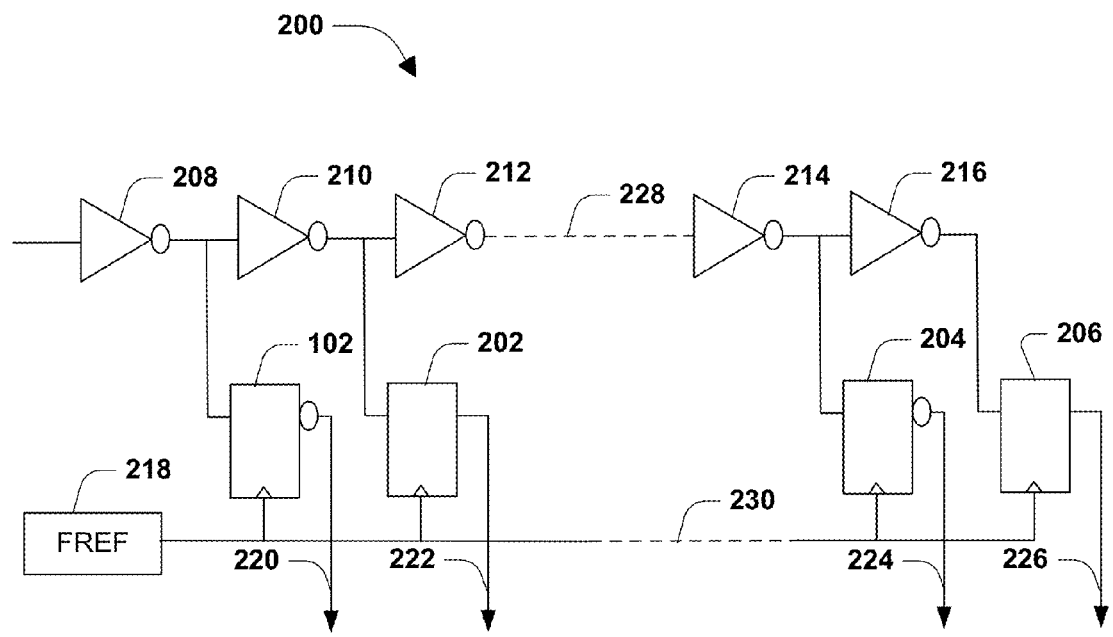
FIG. 2 is an illustration of a phase detector, in accordance with some embodiments.

FIG. 2 illustrates the phase detector 200 comprising a train of inverters 208, 210, 212, 214, 216 coupled to flip-flops 102, 202, 204, 206. In some embodiments, a flip-flop 102 is connected to at least one of an output of a first inverter 208 or an input of a second inverter 210. In some embodiments, a second flip-flop 202 is connected to at least one of an output of the second inverter 210 or an input of a third inverter 212. In some embodiments, a third flip-flop 204 is connected to at least one of an output of a fourth inverter 214 or an input of a fifth inverter 216. In some embodiments, a fourth flip-flop 206 is connected to an output of the fifth inverter 216. In some embodiments, at least one of the flip-flop 102, the second flip-flop 202, the third flip-flop 204 or the fourth flip-flop 206 is connected to a frequency reference 218. In some embodiments, the flip-flop 102 transmits a first Q-output 220. In some embodiments, the second flip-flop 202 transmits a second Q-output 222. In some embodiments, the third flip-flop 204 transmits a third Q-output 224. In some embodiments, the fourth flip-flop transmits a fourth Q-output 226. In some embodiments, a first connection 228 connects one or more other inverters. In some embodiments, a second connection 230 connects one or more other flip-flops. In some embodiments, at least one of the one or more other inverters is connected to at least one of the one or more other flip-flops. In some embodiments, at least one of the one or more flip-flops transmits one or more other Q-outputs.

Figure 3:
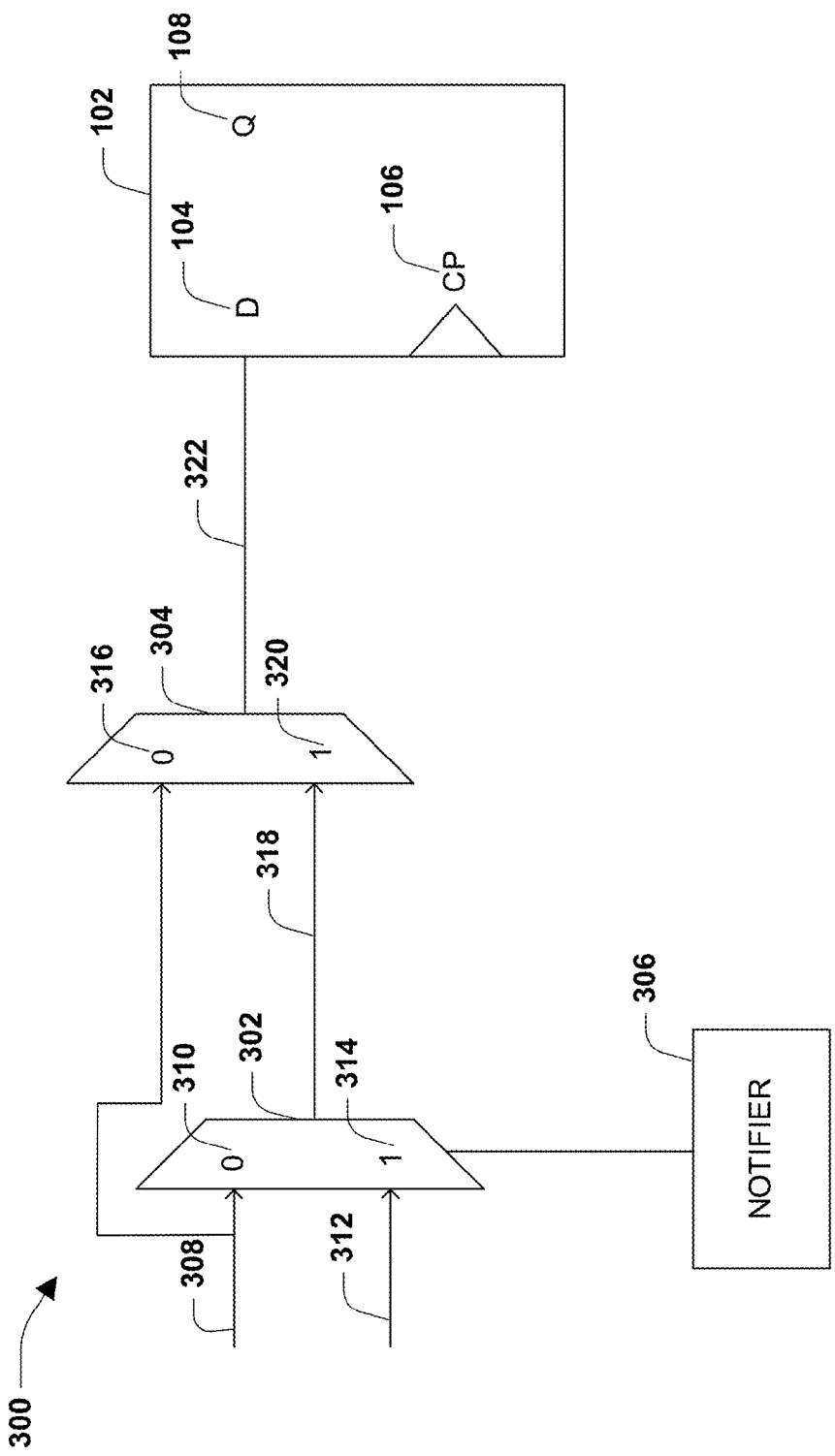
FIG. 3 is an illustration of circuitry for a phase detector, in accordance with some embodiments.

FIG. 3 illustrates circuitry 300 for the phase detector 200, where the circuitry is coupled to the flip-flop 102. The circuitry 300 comprises a first multiplexer 302, a second multiplexer 304 and a notifier 306. In some embodiments, a first modified data signal 308 is received at a 0-input 310 of the first multiplexer 302. In some embodiments, a random value 312 is received at a 1-input 314 of the first multiplexer 302. In some embodiments, the notifier 306 is coupled to the first multiplexer 302. In some embodiments, the notifier 306 determines whether a violation exists in at least one of a setup timing margin or a hold timing margin. In some embodiments, the first modified data signal 308 is received at a 0-input 316 of the second multiplexer 304. In some embodiments, a first multiplexer data signal 318 is transmitted from the first multiplexer 302 to a 1-input 320 of the second multiplexer 304. In some embodiments, a second multiplexer data signal 322 is transmitted from the second multiplexer 304 to the D-input 104 of the flip-flop 102.

Figure 4:
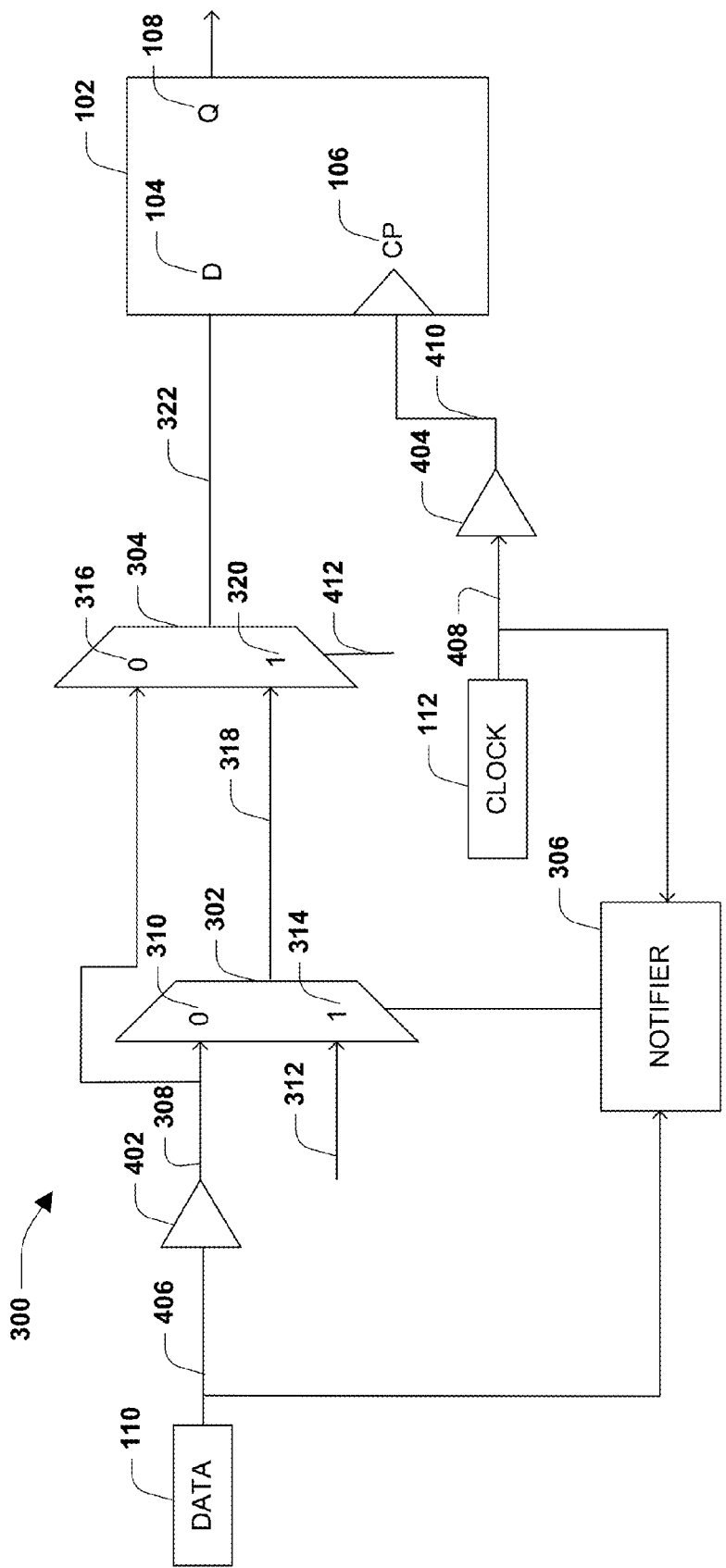
FIG. 4 is an illustration of circuitry for a phase detector, in accordance with some embodiments.

FIG. 4 illustrates the circuitry 300 for the phase detector 200, where the circuitry is coupled to the flip-flop 102. In some embodiments, a first buffer 402 receives a data signal 406 from the data source 110. In some embodiments, the notifier 306 receives the data signal 406 from the data source 110. In some embodiments, the first buffer 402 applies a first delay to the data signal 406 to generate the first modified data signal 308. In some embodiments, the first buffer 402 applies the first delay to the data signal 406 using a first delay signal. In some embodiments, the first modified data signal 308 is transmitted from the first buffer 402 to the 0-input 310 of the first multiplexer 302. In some embodiments, the random value 312 is received at the 1-input 314 of the first multiplexer 302. In some embodiments, the notifier 306 is coupled to the first multiplexer 302. In some embodiments, the notifier 306 is connected to the clock 112. In some embodiments, the notifier 306 is connected to a second buffer 404. In some embodiments, the notifier 306 determines whether a violation exists in at least one of a setup timing margin or a hold timing margin. In some embodiments, the notifier 306 determines whether the violation exists between the clock 112 and the data source 110. In some embodiments, the notifier determines whether the violation exists between a frequency reference associated with the clock 112 and the data signal 406. In some embodiments, the first modified data signal 308 is received at the 0-input 316 of the second multiplexer 304. In some embodiments, the first multiplexer data signal 318 is transmitted from the first multiplexer 302 to the 1-input 320 of the second multiplexer 304. In some embodiments, the second multiplexer data signal 322 is transmitted from the second multiplexer 304 to the D-input 104 of the flip-flop 102. In some embodiments, the second buffer 404 is connected to the CP-input 106 of the flip-flop 102. In some embodiments, the second buffer 404 applies a second delay to a signal 408 to generate a second modified data signal 410. In some embodiments, the signal 408 is a clock signal. In some embodiments, the second buffer 404 applies the second delay to the signal 408 using a second delay signal. In some embodiments, the second delay signal is different than the first delay signal. In some embodiments, the second delay signal is the same as the first delay signal. In some embodiments, the second modified data signal 410 is transmitted from the second buffer 404 to the CP-input 106 of the flip-flop 102. In some embodiments, the clock 112 provides the signal 408 to the second buffer 404. In some embodiments, the clock 112 provides the signal 408 to the notifier 306. In some embodiments, the signal 408 is the same as the data signal 406. In some embodiments, the signal 408 is different than the data signal 406. In some embodiments, the signal 408 is based upon the data signal 406. In some embodiments, a random value turn on control signal 412 is received by the second multiplexer 304.

Figure 5:
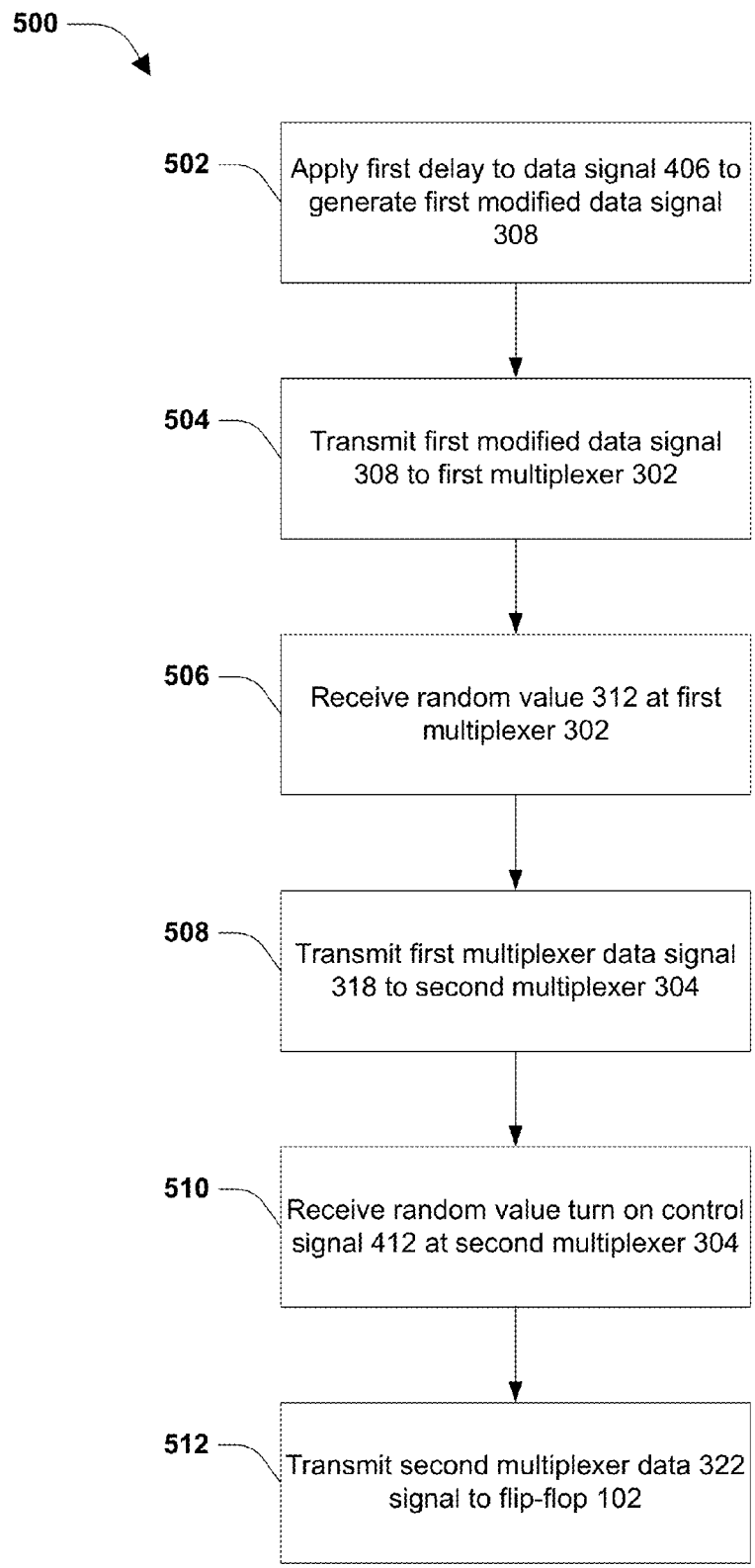
FIG. 5 is an illustration of a flow diagram of a method, in accordance with some embodiments.

FIG. 5 illustrates a method 500 for operating the circuitry 300 for the phase detector 200. At 502, a first delay is applied to a data signal to generate a first modified data signal. In some embodiments, the first delay is applied to the data signal using a first delay signal. In some embodiments, the first delay is applied to the data signal by a buffer. At 504, the first modified data signal is transmitted to a first multiplexer. In some embodiments, the first modified data signal is transmitted to a 0-input of the first multiplexer. In some embodiments, the first modified data signal is transmitted from the buffer to the first multiplexer. At 506, a random value is received at the first multiplexer. In some embodiments, the random value is received at a 1-input of the first multiplexer. At 508, a first multiplexer data signal is transmitted to a second multiplexer. In some embodiments, the first multiplexer data signal is transmitted to a 1-input of the second multiplexer. In some embodiments, a determination is made as to whether a violation exists in at least one of a setup timing margin or a hold timing margin. In some embodiments, a determination is made that the violation exists in at least one of the setup timing margin or the hold timing margin. In some embodiments, in response to the determination that the violation exists in at least one of the setup timing margin or the hold timing margin, the random value is transmitted as the first multiplexer data signal. In some embodiments, a determination is made that the violation does not exist in at least one of the setup timing margin or the hold timing margin. In some embodiments, in response to the determination that the violation does not exist in at least one of the setup timing margin or the hold timing margin, the first modified data signal is transmitted as the first multiplexer data signal. At 510, a random value turn on control signal is received at the second multiplexer. At 512, a second multiplexer data signal is transmitted to a flip-flop. In some embodiments, if the random value turn on control signal comprises 1, the first multiplexer data signal is transmitted as the second multiplexer data signal. In some embodiments, if the random value turn on control signal comprises 0, the first modified data signal is transmitted as the second multiplexer data signal.

Figure 6:
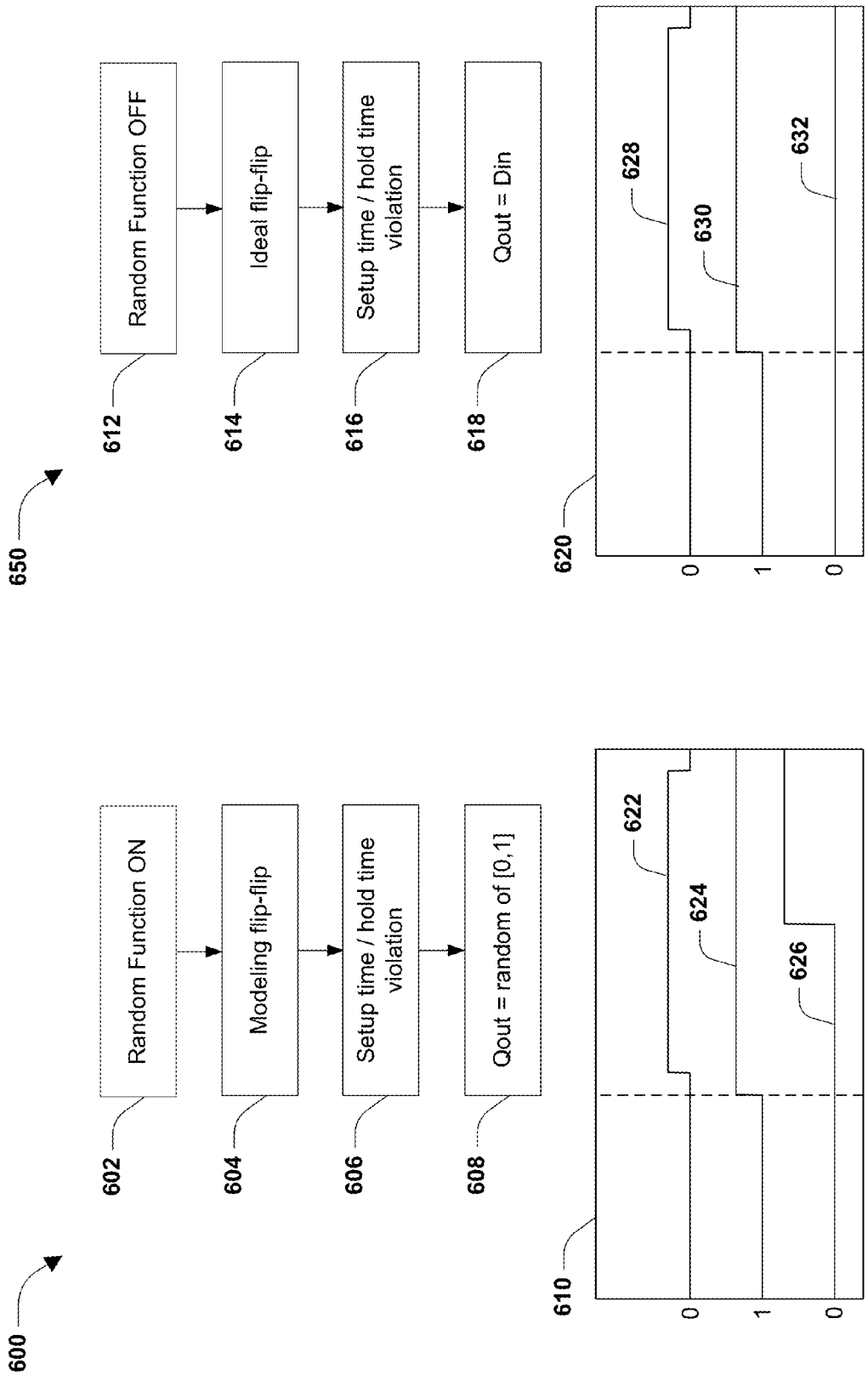
FIG. 6a is an illustration of a flow diagram of a method, in accordance with some embodiments.
FIG. 6b is an illustration of a flow diagram of a method, in accordance with some embodiments.

FIG. 6a illustrates a method 600 for enablement of a random function. In some embodiments, the random function is used to generate the random value 312 described above with regard to FIGS. 3 and 4. At 602, the random function is turned on. In some embodiments, the random function is associated with the phase detector 200. At 604, the flip-flop 102 of the phase detector 200 is modeled. At 606, a determination is made as to whether a violation exists in at least one of a setup timing margin or a hold timing margin. At 608, a random value for the Q-output 108 of the flip-flop 102 is generated. In some embodiments, the random value for the Q-output 108 comprises 0. In some embodiments, the random value for the Q-output 108 comprises 1. In some embodiments, when the random function is turned on, the behavior of the flip-flop 102 is similar to behavior of a real or non-ideal flip-flop. In some embodiments, when the random function is turned on, the behavior of the flip-flop is within a threshold of the behavior of the real flip-flop. Graph 610 illustrates a representation of behavior of the flip-flop 102 when the random function is turned on. Line 622 illustrates behavior of a signal at the D-input 104 of the flip-flop 102. Line 624 illustrates behavior of a signal at the CP-input 106 of the flip-flop 102. Line 626 illustrates behavior of a signal at the Q-output 108 of the flip-flop 102.

FIG. 6b illustrates a method 650 for disablement of a random function. In some embodiments, the random function is used to generate the random value 312 described above with regard to FIGS. 3 and 4. At 612, the random function is turned off. In some embodiments, the random function is associated with the phase detector 200. At 614, the flip-flop 102 of the phase detector 200 is modeled as an ideal flip-flop. At 616, a determination is made as to whether a violation exists in at least one of a setup timing margin or a hold timing margin. At 618, a value for the Q-output 108 is generated. In some embodiments, the Q-output is equal to a value at the D-input 104 of the flip-flop. In some embodiments, the value for the Q-output 108 comprises 0. In some embodiments, the value for the Q-output 108 comprises 1. In some embodiments, when the random function is turned off, the behavior of the flip-flop 102 is similar to behavior of an ideal flip-flop.

In some embodiments, when the random function is turned off, the behavior of the flip-flop 102 is within a threshold of the behavior of the ideal flip-flop. Graph 620 illustrates a representation of behavior of the flip-flop 102 when the random function is turned off. Line 628 illustrates behavior of a signal at the D-input 104 of the flip-flop 102. Line 630 illustrates behavior of a signal at the CP-input 106 of the flip-flop 102. Line 632 illustrates behavior of a signal at the Q-output 108 of the flip-flop 102. In some embodiments, a difference between line 632 and line 626 is representative of a difference between the behavior of the Q-output of the flip-flop when the random function is turned on and the behavior of the Q-output of the flip-flop when the random function is turned off. In some embodiments, line 632 is representative of a constant level associated with the Q-output of the flip-flop when the random function is turned off. In some embodiments, at least part of line 632 is equal to at least part of line 628 at a rising edge of line 630 when there exists a setup time violation or a hold time violation when the random function is turned off. In some embodiments, line 626 is representative of a change in a level associated with the Q-output of the flip-flop. In some embodiments, a value of line 626 is random when both the random function is turned on and there exists a setup time violation or a hold time violation.

Figure 7:
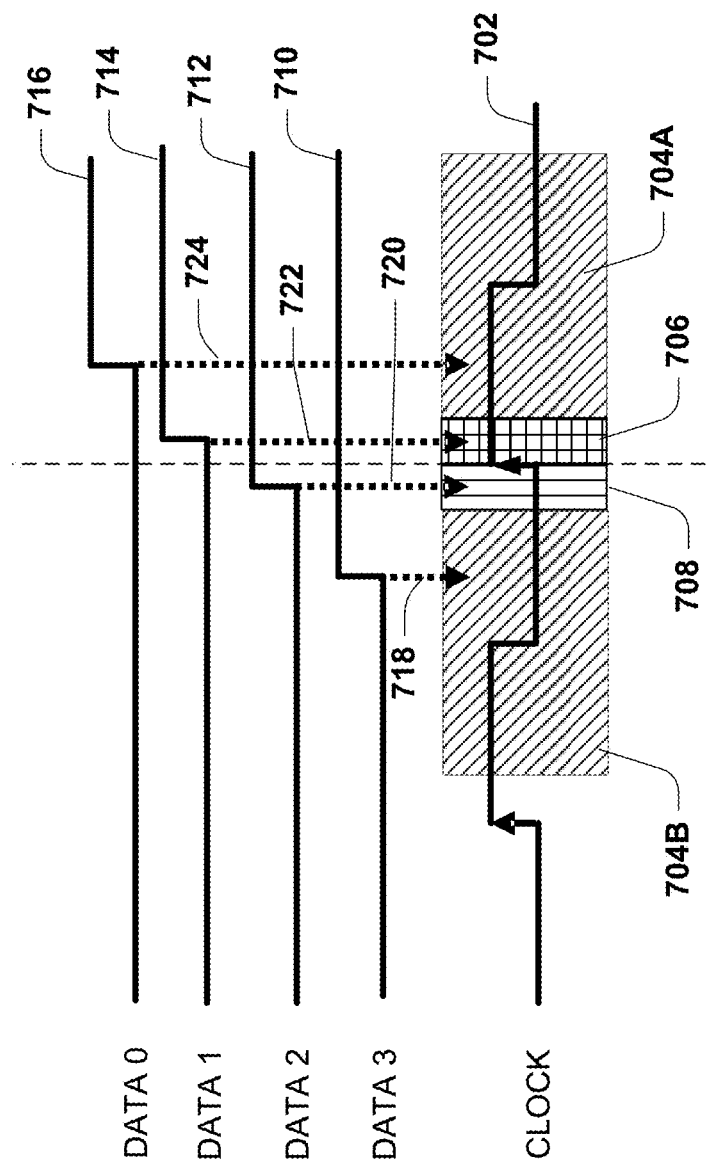
FIG. 7 is an illustration of behavior of a circuit, in accordance with some embodiments.

FIG. 7 illustrates a representation of behavior associated with the phase detector 200. Line 702 illustrates behavior associated with a clock. Region 704A and region 704B illustrate margins associated with a non-existence of a violation. In some embodiments, region 704A and region 704B illustrate margins associated with a non-existence of at least one of a hold timing violation or a setup timing violation. Region 706 illustrates a margin associated with an existence of a violation. In some embodiments, region 706 illustrates a margin associated with an existence of a hold timing violation. Region 708 illustrates a margin associated with an existence of a violation. In some embodiments, region 708 illustrates a margin associated with an existence of a setup timing violation. Line 710 illustrates behavior associated with third data associated with the flip-flop. Line 712 illustrates behavior associated with second data associated with the flip-flop. Line 714 illustrates behavior associated with first data associated with the flip-flop. Line 716 illustrates behavior associated with zero data associated with the flip-flop. In some embodiments, a transition of a line represents an association of the line with at least one of region 704A, region 704B, region 706 or region 708. In some embodiments, transition 718 of line 710 indicates that line 710 and the third data are associated with region 704B. In some embodiments, transition 718 of line 710 indicates that line 710 and the third data are associated with a non-existence of at least one of a hold timing violation or a setup timing violation. In some embodiments, transition 720 of line 712 indicates that line 712 and the second data are associated with region 708. In some embodiments, transition 720 of line 712 indicates that line 712 and the second data are associated with an existence of a setup timing violation. In some embodiments, transition 722 of line 714 indicates that line 714 and the first data are associated with region 706. In some embodiments, transition 722 of line 714 indicates that line 714 and the first data are associated with an existence of a hold timing violation. In some embodiments, transition 724 of line 716 indicates that line 716 and the zero data are associated with region 704A. In some embodiments, transition 724 of line 716 indicates that line 716 and the zero data are associated with a non-existence of at least one of a hold timing violation or a setup timing violation. In some embodiments, at least one of the third data, the second data, the first data or the zero data corresponds to at least one of the data source 110, the clock 112, the D-input 104, the CP-input 106 or the Q-output 108.

Figure 8:
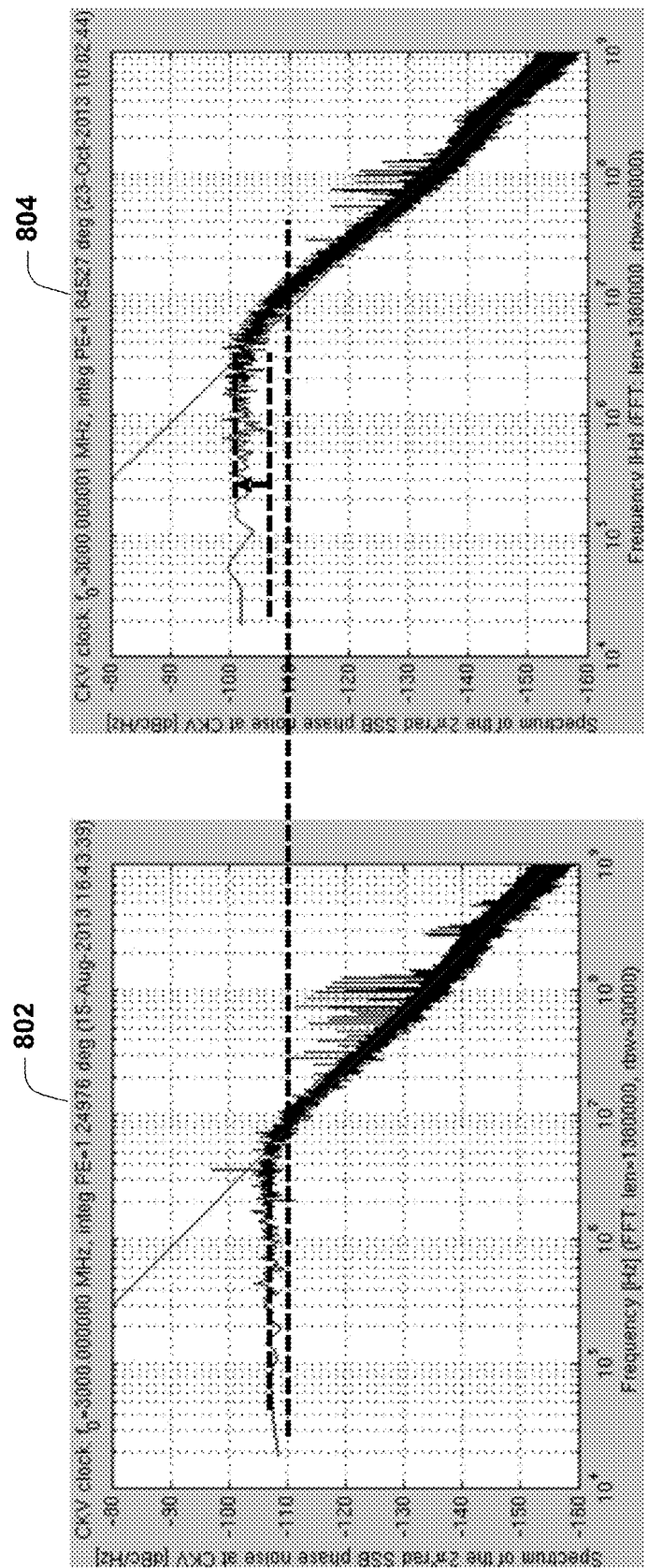
FIG. 8 is an illustration of behavior of a circuit, in accordance with some embodiments.

FIG. 8 illustrates behavior of a circuit associated with a flip-flop. Graph 802 illustrates measurements associated with a flip-flop that does not have a violation. In some embodiments, a phase jitter associated with graph 802 is 1.2 ps. In some embodiments, a reference clock frequency associated with graph 802 is the same as or similar to 200 MHz. In some embodiments, a noise floor of in-band associated with graph 802 is the same as or similar to −107 dBc/Hz. Graph 804 illustrates measurements associated with a flip-flop that does have a violation. In some embodiments, a phase jitter associated with graph 804 is 1.7 ps. In some embodiments, a reference clock frequency associated with graph 804 is the same as or similar to 200 MHz. In some embodiments, a noise floor of in-band associated with graph 804 is the same as or similar to −102 dBc/Hz.

Figure 9:
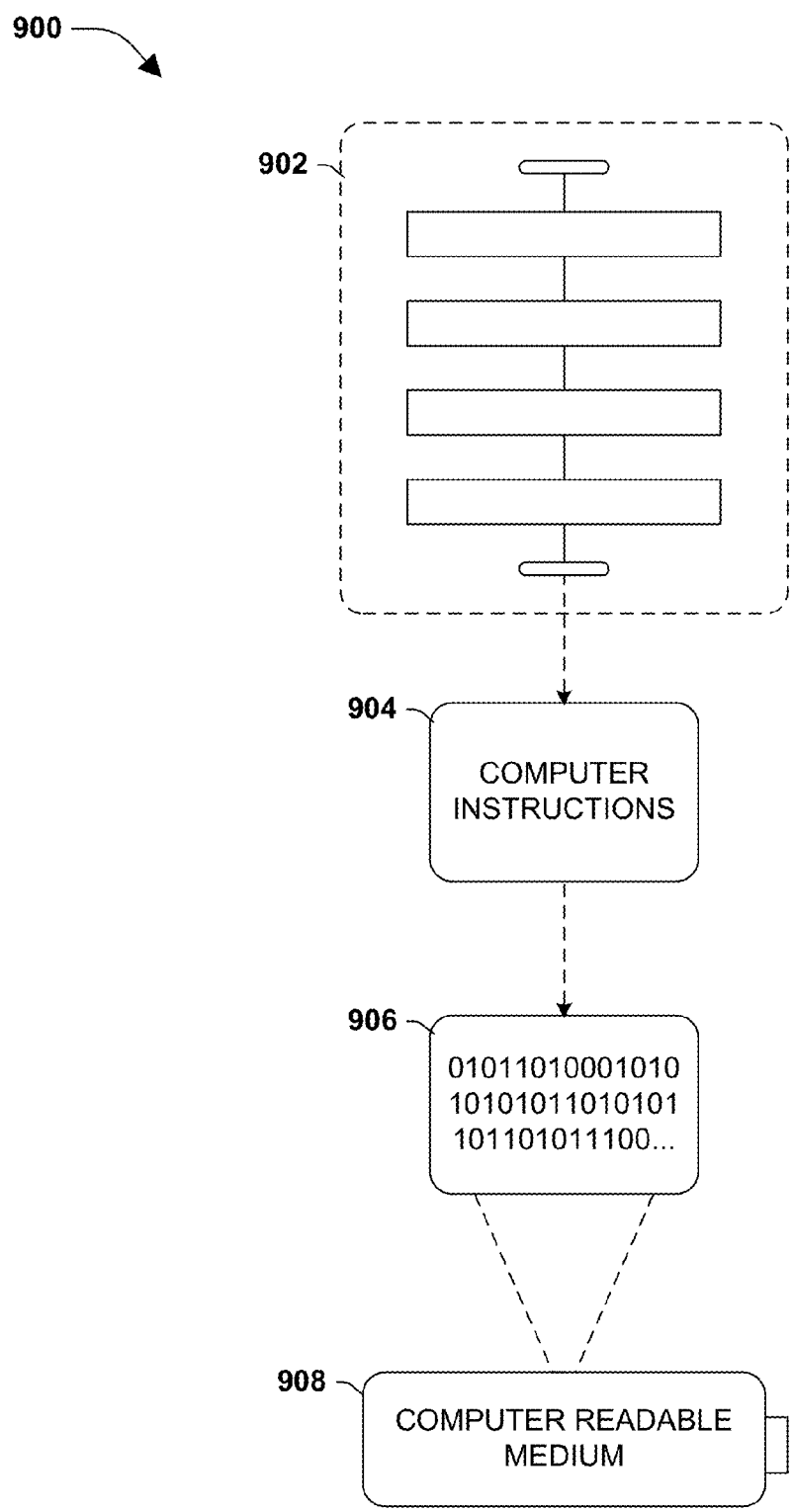
FIG. 9 is an illustration of an example computer-readable medium or computer-readable device comprising processor-executable instructions configured to embody one or more of the provisions set forth herein, according to some embodiments.

Still another embodiment involves a computer-readable medium comprising processor-executable instructions configured to implement one or more of the techniques presented herein. An example embodiment of a computer-readable medium and/or a computer-readable device that is devised in these ways is illustrated in FIG. 9, wherein the implementation 900 comprises a computer-readable medium 908, such as a CD-R, DVD-R, flash drive, a platter of a hard disk drive, etc., on which is encoded computer-readable data 906. This computer-readable data 906 in turn comprises a set of computer instructions 904 configured to operate according to one or more of the principles set forth herein. In one such embodiment 900, the processor-executable computer instructions 904 is configured to perform a method 902, such as at least some of the exemplary method 500 of FIG. 5, at least some of exemplary method 600 of FIG. 6a and/or at least some of exemplary method 650 of FIG. 6b, for example. Many such computer-readable media are devised by those of ordinary skill in the art that are configured to operate in accordance with the techniques presented herein.

In some embodiments, a circuit for a phase detector is provided. In some embodiments, the circuit comprises a first buffer configured to receive a data signal apply a first delay to the data signal, using a first delay signal, to generate a first modified data signal. In some embodiments, the system comprises a notifier configured to receive the data signal, and determine whether a violation exists in at least one of a setup timing margin or a hold timing margin. In some embodiments, the system comprises a first multiplexer configured to receive the first modified data signal from the buffer at a 0-input of the first multiplexer, receive a random value at a 1-input of the first multiplexer, and transmit a first multiplexer data signal, comprising responsive to the notifier determining that the violation exists in at least one of the setup timing margin or the hold timing margin, transmitting the random value as the first multiplexer data signal, and responsive to the notifier determining that the violation does not exist in at least one of the setup timing margin or the hold timing margin, transmitting the first modified data signal from the buffer as the first multiplexer data signal. In some embodiments, the system comprises a second multiplexer configured to receive the first modified data signal from the buffer at a 0-input of the second multiplexer, receive the first multiplexer data signal from the first multiplexer at a 1-input of the second multiplexer, receive a random value turn on control signal, and transmit a second multiplexer data signal to a D-pin of a flip-flop of the phase detector, comprising responsive to the random value turn on control signal comprising 1, transmitting the first multiplexer data signal as the second multiplexer data signal, and responsive to the random value turn on control signal comprising 0, transmitting the first modified data signal from the buffer as the second multiplexer data signal.

In some embodiments, a method is provided. In some embodiments, the method comprises applying a first delay to a data signal, using a first delay signal, to generate a first modified data signal using a buffer. In some embodiments, the method comprises transmitting the first modified data signal from the buffer to a 0-input of a first multiplexer. In some embodiments, the method comprises receiving a random value at a 1-input of the first multiplexer. In some embodiments, the method comprises transmitting a first multiplexer data signal from the first multiplexer to a 1-input of a second multiplexer, comprising responsive to determining that a violation exists in at least one of a setup timing margin or a hold timing margin, transmitting the random value as the first multiplexer data signal, and responsive to determining that the violation does not exist in at least one of the setup timing margin or the hold timing margin, transmitting the first modified data signal from the buffer as the first multiplexer data signal. In some embodiments, the method comprises receiving a random value turn on control signal at the second multiplexer. In some embodiments, the method comprises transmitting a second multiplexer data signal from the second multiplexer to a D-pin of a flip-flop of a phase detector, comprising responsive to the random value turn on control signal comprising 1, transmitting the first multiplexer data signal as the second multiplexer data signal, and responsive to the random value turn on control signal comprising 0, transmitting the first modified data signal from the buffer as the second multiplexer data signal.

In some embodiments, a circuit for a phase detector is provided. In some embodiments, the system comprises a first multiplexer configured to receive a first modified data signal at a 0-input of the first multiplexer, receive a random value at a 1-input of the first multiplexer, and transmit a first multiplexer data signal, comprising responsive determining that a violation exists in at least one of a setup timing margin or a hold timing margin, transmitting the random value as the first multiplexer data signal, and responsive to determining that the violation does not exist in at least one of the setup timing margin or the hold timing margin, transmitting the first modified data signal as the first multiplexer data signal. In some embodiments, the system comprises a second multiplexer configured to receive the first modified data signal at a 0-input of the second multiplexer, receive the first multiplexer data signal from the first multiplexer at a 1-input of the second multiplexer, and transmit a second multiplexer data signal to a flip-flop of the phase detector, comprising responsive to the random value turn on control signal comprising 1, transmitting the first multiplexer data signal as the second multiplexer data signal, and responsive to the random value turn on control signal comprising 0, transmitting the first modified data signal as the second multiplexer data signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A circuit for a phase detector, comprising:
   a first buffer configured to:
     receive a data signal; and
     apply a first delay to the data signal, using a first delay signal, to generate a first modified data signal;
   a notifier configured to:
     receive the data signal; and
     determine whether a violation exists in at least one of a setup timing margin or a hold timing margin;
   a first multiplexer configured to:
     receive the first modified data signal from the buffer at a 0-input of the first multiplexer;
     receive a random value at a 1-input of the first multiplexer; and
     transmit a first multiplexer data signal, comprising:
       responsive to the notifier determining that the violation exists in at least one of the setup timing margin or the hold timing margin, transmitting the random value as the first multiplexer data signal; and
       responsive to the notifier determining that the violation does not exist in at least one of the setup timing margin or the hold timing margin, transmitting the first modified data signal from the buffer as the first multiplexer data signal; and a second multiplexer configured to:
receive the first modified data signal from the buffer at a 0-input of the second multiplexer;
receive the first multiplexer data signal from the first multiplexer at a 1-input of the second multiplexer;
receive a random value turn on control signal; and
transmit a second multiplexer data signal to a D-pin of a flip-flop of the phase detector, comprising:
responsive to the random value turn on control signal comprising 1, transmitting the first multiplexer data signal as the second multiplexer data signal; and
responsive to the random value turn on control signal comprising 0, transmitting the first modified data signal from the buffer as the second multiplexer data signal.

2. The system of claim 1, comprising a second buffer configured to:
apply a second delay to a clock signal, using a second delay signal, to generate a second modified data signal.

3. The system of claim 1, comprising a clock configured to:
transmit a clock signal to at least one of the notifier or a second buffer.

4. The system of claim 2, comprising a clock configured to:
transmit the clock signal to at least one of the notifier or the second buffer.

5. The system of claim 2, the second delay signal different than the first delay signal.

6. A method, comprising:
applying a first delay to a data signal, using a first delay signal, to generate a first modified data signal using a buffer;
transmitting the first modified data signal from the buffer to a 0-input of a first multiplexer;
receiving a random value at a 1-input of the first multiplexer;
transmitting a first multiplexer data signal from the first multiplexer to a 1-input of a second multiplexer, comprising:
responsive to determining that a violation exists in at least one of a setup timing margin or a hold timing margin, transmitting the random value as the first multiplexer data signal; and
responsive to determining that the violation does not exist in at least one of the setup timing margin or the hold timing margin, transmitting the first modified data signal from the buffer as the first multiplexer data signal;
receiving a random value turn on control signal at the second multiplexer; and
transmitting a second multiplexer data signal from the second multiplexer to a D-pin of a flip-flop of a phase detector, comprising:
responsive to the random value turn on control signal comprising 1, transmitting the first multiplexer data signal as the second multiplexer data signal; and
responsive to the random value turn on control signal comprising 0, transmitting the first modified data signal from the buffer as the second multiplexer data signal.

7. The method of claim 6, comprising:
applying a second delay to a clock signal, using a second delay signal, to generate a second modified data signal using a second buffer.

8. The method of claim 6, at least one of the determining that a violation exists or the determining that the violation does not exist based upon a clock signal.

9. The method of claim 7, the second delay signal different than the first delay signal.

10. A circuit for a phase detector, comprising:
a first multiplexer configured to:
receive a first modified data signal at a 0-input of the first multiplexer;
receive a random value at a 1-input of the first multiplexer; and
transmit a first multiplexer data signal, comprising:
responsive determining that a violation exists in at least one of a setup timing margin or a hold timing margin, transmitting the random value as the first multiplexer data signal; and
responsive to determining that the violation does not exist in at least one of the setup timing margin or the hold timing margin, transmitting the first modified data signal as the first multiplexer data signal; and
a second multiplexer configured to:
receive the first modified data signal at a 0-input of the second multiplexer;
receive the first multiplexer data signal from the first multiplexer at a 1-input of the second multiplexer;
receive a random value turn on control signal; and
transmit a second multiplexer data signal to a flip-flop of the phase detector, comprising:
responsive to the random value turn on control signal comprising 1, transmitting the first multiplexer data signal as the second multiplexer data signal; and
responsive to the random value turn on control signal comprising 0, transmitting the first modified data signal as the second multiplexer data signal.

11. The system of claim 10, the second multiplexer configured to transmit the second multiplexer data signal to a D-pin of the flip-flop.

12. The system of claim 10, the random value comprising at least one of 0 or 1.

13. The system of claim 10, comprising a first buffer configured to:
receive a data signal; and
apply a first delay to the data signal, using a first delay signal, to generate the first modified data signal.

14. The system of claim 10, comprising a notifier configured to:
receive a data signal; and
determine whether the violation exists in at least one of the setup timing margin or the hold timing margin based upon the data signal.

15. The system of claim 10, the first multiplexer configured to receive the first modified data signal from a first buffer.

16. The system of claim 10, the first multiplexer different than the second multiplexer.

17. The system of claim 10, comprising a second buffer configured to:
receive a clock signal; and
apply a second delay to the clock signal, using a second delay signal, to generate a second modified data signal.

18. The system of claim 14, comprising a clock configured to:
transmit a clock signal to the notifier.

19. The system of claim 17, comprising a clock configured to:
transmit the clock signal to the second buffer.

20. The system of claim 17, the second delay signal different than a first delay signal used to generate the first modified data signal.

* * * * *